(12) United States Patent
Li

(10) Patent No.: US 11,946,971 B2
(45) Date of Patent: Apr. 2, 2024

(54) POWER CIRCUIT AND TESTING DEVICE

(71) Applicants:CHONGQING HKC OPTOELECTRONICS TECHNOLOGY CO., LTD., Chongqing (CN); HKC CORPORATION LIMITED, Shenzhen (CN)

(72) Inventor: Wenxin Li, Chongqing (CN)

(73) Assignees: CHONGQING HKC OPTOELECTRONICS TECHNOLOGY CO., LTD., Chongqing (CN); HKC CORPORATION LIMITED, Shenzhen (CN)

( * ) Notice: Subject to any disclaimer, the term of this patent is extended or adjusted under 35 U.S.C. 154(b) by 808 days.

(21) Appl. No.: 17/033,823

(22) Filed: Sep. 27, 2020

(65) Prior Publication Data

US 2021/0011083 A1    Jan. 14, 2021

Related U.S. Application Data

(63) Continuation of application No. PCT/CN2018/121640, filed on Dec. 18, 2018.

(30) Foreign Application Priority Data

Sep. 13, 2018   (CN) .......................... 201811070995.3

(51) Int. Cl.
*G01R 31/40*   (2020.01)
*G01R 31/317*   (2006.01)
(Continued)

(52) U.S. Cl.
CPC ....... *G01R 31/31721* (2013.01); *G01R 31/40* (2013.01); *H03K 17/145* (2013.01); *H03K 17/687* (2013.01); *H03K 17/74* (2013.01)

(58) Field of Classification Search
CPC .............. G01R 31/31721; G01R 31/40; G01R 31/2635; G01R 33/00; G01R 33/0035;
(Continued)

(56) References Cited

U.S. PATENT DOCUMENTS

| 2004/0252090 A1* | 12/2004 | Hsu ........................ G09G 3/006 345/87 |
| 2015/0378383 A1 | 12/2015 | Hsu |
| 2017/0115897 A1* | 4/2017 | Franke .................. G06F 3/0616 |

FOREIGN PATENT DOCUMENTS

| CN | 1378256 A | 11/2002 |
| CN | 1818706 A | 8/2006 |

(Continued)

OTHER PUBLICATIONS

First Office Action in counterpart Chinese Application No. 201811070995.3, dated Jul. 18, 2019.
(Continued)

*Primary Examiner* — Jermele M Hollington
*Assistant Examiner* — Taqi R Nasir
(74) *Attorney, Agent, or Firm* — Westbridge IP LLC

(57) ABSTRACT

A power circuit and a testing device are provided. A first voltage output circuit of the power circuit provides normal working voltage to electronic device, and a second voltage output circuit provides aging voltage to electronic device. The aging voltage is greater than the normal working voltage, and a controller stores a preset failure rate curve of an electronic device and controls switching of output voltages of the first voltage output circuit and the second voltage output circuit according to the preset failure rate curve.

16 Claims, 2 Drawing Sheets

(51) Int. Cl.
   *H03K 17/14*      (2006.01)
   *H03K 17/687*     (2006.01)
   *H03K 17/74*      (2006.01)

(58) Field of Classification Search
   CPC .......... G01R 33/0023; G01R 33/0017; G01R 31/3191; H03K 17/145; H03K 17/687; H03K 17/74; G01B 7/004; G01C 17/38; G06F 3/017; G06F 3/0346; G06F 3/012
   See application file for complete search history.

(56) References Cited

FOREIGN PATENT DOCUMENTS

| | | | | | |
|---|---|---|---|---|---|
| CN | 101604605 | A | | 12/2009 | |
| CN | 201436591 | U | | 4/2010 | |
| CN | 201594035 | U | * | 9/2010 | ............ G01M 13/00 |
| CN | 201594035 | U | | 9/2010 | |
| CN | 103389424 | A | | 11/2013 | |
| CN | 204439806 | U | | 7/2015 | |
| CN | 105911485 | A | | 8/2016 | |
| CN | 205643663 | U | | 10/2016 | |
| CN | 107192965 | A | | 9/2017 | |
| CN | 108957360 | A | | 12/2018 | |
| EP | 1978370 | A1 | | 10/2008 | |
| IN | 203490353 | U | | 3/2014 | |
| JP | H08136898 | A | | 5/1996 | |

OTHER PUBLICATIONS

International Search Report and Written Opinion in corresponding PCT Application No. PCT/CN2018/121640, dated Jun. 12, 2019.

* cited by examiner

POWER CIRCUIT AND TESTING DEVICE

CROSS-REFERENCE TO RELATED APPLICATIONS

The present application is a continuation application of International Application No. PCT/CN2018/121640, filed on Dec. 18, 2018, which claims the benefit of Chinese Patent Application No. 201811070995.3, entitled "POWER CIRCUIT AND TESTING DEVICE", filed on Sep. 13, 2018, which is hereby incorporated by reference in its entirety.

FIELD

The present application relates to the technical field of product testing, and in particular, relates to a power circuit and a testing device.

BACKGROUND

Nowadays, quality test of electronic products is mostly conducted in such a way that each component of the electronic products is tested during producing, and the product after being completed is then operated to be detected. The qualified products would directly be shipped to retailers. However, the various components in the electronic products may be inconsistent, the electronic products that run well when they leave the factory are also perhaps unstable in performance when they are delivered to customers, which results in customer complaints and adverse impact.

SUMMARY

The main purpose of the present application is to provide a power circuit to solve the problem of high failure rate of the products after leaving factory.

In order to achieve the above object, the present application provides a power circuit for an electronic device, and the power circuit includes:
 a first voltage output circuit configured to provide a normal operating voltage to the electronic device;
 a second voltage output circuit configured to provide an aging voltage to the electronic device, the aging voltage being greater than the normal operating voltage;
 a controller configured to store a preset failure rate curve of the electronic device; and
 a switch control circuit configured to switch on/off based on control of the controller according to the preset failure rate curve of the electronic device, thus to control the first voltage output circuit or the second voltage output circuit to provide a voltage to the electronic device.

Optionally, the preset failure rate curve of the electronic device is configured to indicate a failure rate of the electronic device during working, and corresponds to an initial, an intermediate, and a later working periods of the electronic device according to total working periods of the electronic device. And in the initial working period, the controller controls the switch control circuit to be turned on or off at a first preset frequency according to a preset periodic control signal, so that the electronic device reaches a target degree of aging.

Optionally, the first voltage output circuit includes a first power supply, and the first power supply includes a positive pole and a negative pole.

Optionally, the switch control circuit includes a first switch tube defined with a first connection terminal, a second connection terminal, and a controlled terminal, the controlled terminal of the first switch tube is the controlled terminal of the switch control circuit, the first connection terminal of the first switch tube is the first input terminal of the switch control circuit, and the second connection terminal of the first switch tube is the second input terminal of the switch control circuit, and is also the output terminal of the switch control circuit.

Optionally, the first switch tube is a positive channel Metal Oxide Semiconductor, a grid of the positive channel Metal Oxide Semiconductor is the controlled terminal of the first switch tube, a source of the positive channel Metal Oxide Semiconductor is the first terminal of the first switch tube, and a drain of the positive channel Metal Oxide Semiconductor is the second terminal of the first switch tube.

Optionally, the second voltage output circuit includes a first energy storage circuit, a second energy storage circuit, and a unilateral conduction circuit, an input terminal of the first energy storage circuit is an input terminal of the second voltage output circuit, and an output terminal of the first energy storage circuit is respectively connected with an input terminal of the unilateral conduction circuit and the first connection terminal of the first switch tube; an output terminal of the unilateral conduction circuit is connected with a first terminal of the second energy storage circuit, and a connection node of the unilateral conduction circuit and the second energy storage circuit is the output terminal of the second voltage output circuit; and a second terminal of the second energy storage circuit is connected with the second connection terminal of the first switch tube.

Optionally, the first energy storage circuit includes a first inductor, a first terminal of the first inductor is the input terminal of the first energy storage circuit, and a second terminal of the first inductor is the output terminal of the first energy storage circuit.

Optionally, the second energy storage circuit includes a first capacity, a first terminal of the first capacity is the first terminal of the second energy storage circuit, and a second terminal of the first capacity is the second terminal of the second energy storage circuit.

Optionally, the unilateral conduction circuit includes a first diode, an anode of the first diode is the input terminal of the unilateral conduction circuit, and a cathode of the first diode is the output terminal of the unilateral conduction circuit.

In addition, the present application also provides a power circuit for an electronic device, and the power circuit includes:
 a first voltage output circuit configured to provide a normal operating voltage to the electronic device;
 a second voltage output circuit configured to provide an aging voltage to the electronic device, the aging voltage being greater than the normal operating voltage;
 a controller configured to store a preset failure rate curve of the electronic device; and
 a switch control circuit configured to switch on/off based on control of the controller according to the preset failure rate curve of the electronic device, thus to control the first voltage output circuit or the second voltage output circuit to provide a voltage to the electronic device; and
 the preset failure rate curve of the electronic device is configured to indicate a failure rate of the electronic device during working, and corresponds to an initial working period, an intermediate working period, and a later working period of the electronic device according to total working period of the electronic device, and in the initial working period, the controller controls the switch control circuit to be turned on or off at a first preset frequency according to a preset periodic control signal, so that the electronic device reaches a target degree of aging.

In addition, the application also provides a testing device, which includes the power circuit, the first output terminal of the power circuit is connected with an positive input terminal of the electronic device, the second output terminal of the power circuit is connected with a negative input terminal of the electronic device, and the input terminal of the controller of the power circuit is connected with a to-be-tested terminal of the electronic device.

The power circuit provided by the present application includes a first voltage output circuit, a second voltage output circuit, a controller and a switch control circuit, the first voltage output circuit provides normal working voltage to the electronic device, the second voltage output circuit provides aging voltage to the electronic device, the aging voltage is larger than the normal working voltage, and the controller stores a preset failure rate curve of the electronic device, the switch control circuit switches on/off based on control of the controller according to the preset failure rate curve of the electronic device, thus to control the first voltage output circuit or the second voltage output circuit to provide a voltage to the electronic device. The power circuit provided by the present application may supply an aging voltage and a normal voltage of an electronic device, and may switch between the aging voltage and the normal voltage, so as to accelerate the aging speed of the electronic device. Thereby, the electronic products are leaved in a stable stage before leaving factory, and the fault of the electronic products due to their earlier instability is avoided. As such, the products received by customers are stable and not prone to failure, thereby complaints from consumers is reduced and the quality of the electronic products is improved.

BRIEF DESCRIPTION OF THE DRAWINGS

In order to more clearly explain the embodiment of the application or the technical scheme in the prior art, the following will briefly introduce the drawings needed in the description of the embodiment or the prior art. Obviously, the drawings in the following description are only some embodiments of the application. For those of ordinary skill in the art, other drawings can be obtained according to the structure shown in these drawings without creative labor.

Figure 1:
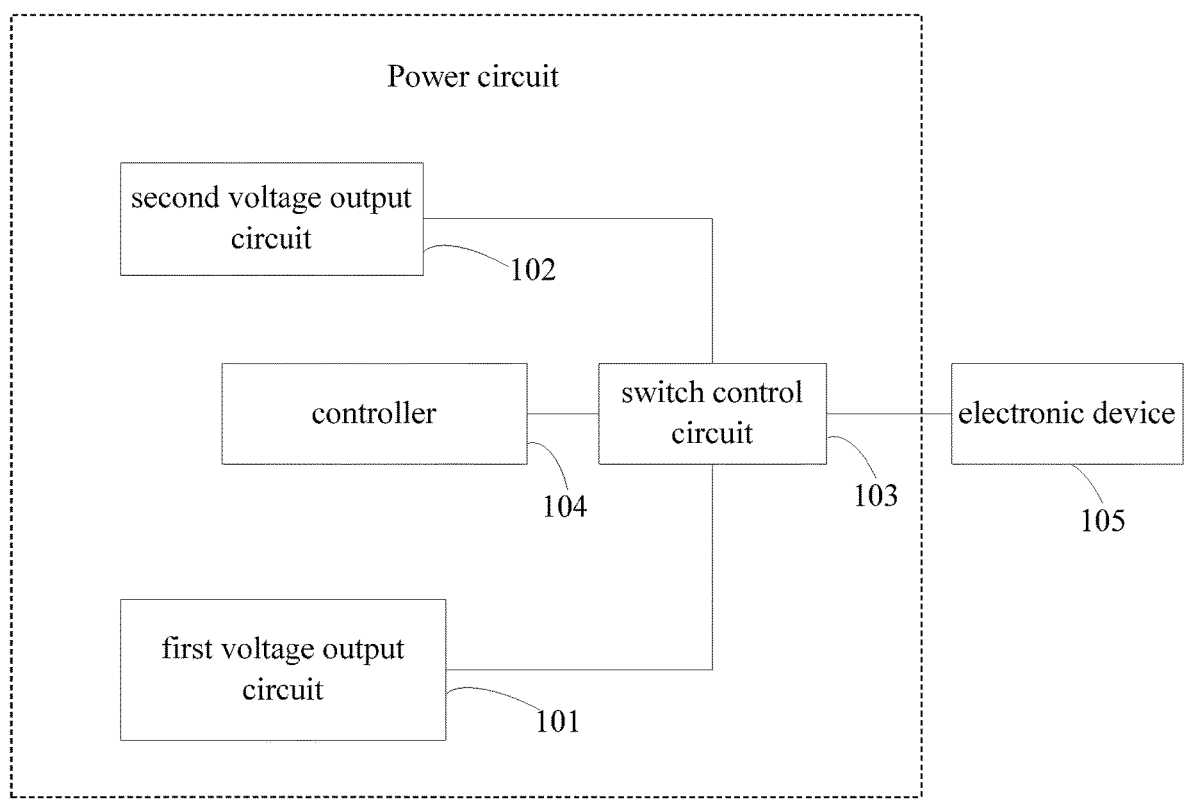
FIG. 1 is a schematic structural diagram illustrating modules of a power circuit of the present application.

The realization, functional features and advantages of the purpose of the present disclosure will be further described with reference to the accompanying drawings in conjunction with the embodiments.

DETAILED DESCRIPTION OF THE EMBODIMENTS

It should be understood that the specific embodiments described herein are only for the purpose of explaining the present disclosure and are not intended to limit the present disclosure.

The technical scheme in the embodiment of the present disclosure will be described clearly and completely in the following with reference to the drawings in the embodiment of the present disclosure. Obviously, the described embodiment is only a part of the embodiment of the present disclosure, but not all of the embodiments. All other embodiments obtained by persons skilled in the art based on the embodiments of the present disclosure without creative efforts shall fall within the protection scope of the present disclosure.

It should be noted that all directional indications (such as up, down, left, right, front, back, etc.) in the embodiments of the present disclosure are only used to explain the relative positional relationship, movement, etc. between the components in a certain posture (as shown in the drawings), and if the specific posture changes, the directional indication changes accordingly.

In addition, in this disclosure, the descriptions such as "second" and "multiple" are set for the purpose of description only, and are not to be understood as indicating or implying its relative importance or implicitly indicating the number of indicated technical features. Thus, features defining "second" and "multiple" may explicitly or implicitly include at least two such features. In addition, the technical solutions in the various embodiments may be combined with each other, on the premise that one of ordinary skill in the art may achieve the combinations. When a combination of technical solutions is contradictory or impossible to achieve, it should be considered that such combination does not exist and is not within the scope of protection required by the present application.

The present application proposes a power circuit, as shown in FIG. 1, the power circuit for electronic device includes a first voltage output circuit 101, a second voltage output circuit 102, a controller 104, and a switch control circuit 103. the switch control circuit 103 includes a first input terminal, a second input terminal, a controlled terminal and an output terminal, an output terminal of the first voltage output circuit 101 is connected with the first input terminal of the switch control circuit, and an output terminal of the second voltage output circuit 102 is connected with the second input terminal of the switch control circuit; the controlled terminal of the switch control circuit 103 is connected with an output terminal of the controller, and the output terminal of the switch control circuit 103 is connected with an input terminal of the electronic device.

The first voltage output circuit 101 provides a normal operating voltage to the electronic device 105, and the normal operating voltage is the voltage of the electronic device 105 in normal working. In the exemplary technology, different electronic devices 105 have different operating voltages, and the normal operating voltage may be adjusted according to actual needs so as to be suitable for a variety of different electronic devices. The second voltage output circuit 102 provides an aging voltage to the electronic device 105, the aging voltage is greater than the normal operating voltage, the aging voltage in the case is the voltage value of the electronic device 105 operating in a limit state, and the aging voltage value of the electronic device 105 is measured in an experiment. The controller 104 stores a preset failure rate curve of an electronic device, and sets one current working period of the power circuit according to the failure rate curve of the electronic device 105. Optionally, the failure rate of most devices is a function of time. A typical failure curve is called the bathtub curve. The shape of the curve is high at two ends and low in the middle, which obviously shows different phases. The phases may be divided into three: early failure period, accidental failure period and severe failure period. Therefore, the current working time is the time length of the curve which represents the early failure rate in the failure rate curve of the electronic device 105. Because in this period, the electronic devices 105 of all types are most likely to fail, making the stability of sold products worse as a result. And, different types of electronic device 105 have different time lengths of the curve representing the early failure rate, which may be obtained in various ways, such as by statistical repair rate of ex-factory products. Then, the controller 104 also outputs a control signal to control the switch control circuit 103 to supply power to the electronic device 105, thereby accelerating the aging, and screening out defective electronic device while accelerating the aging. The early defective rate of the ex-factory electronic devices 105 is reduced as a result. The switch control circuit 103 performs on/off based on the control output by the controller 104 according to a preset failure rate curve of the electronic device, controlling the first voltage output circuit 101 or the second voltage output circuit 102 to output voltage to the electronic device 105. The switch control circuit 103 enables different output terminals of the second voltage output circuits 102 to be gated with the first voltage output circuit 101. When the switch control circuit 103 is off, the path between the first output terminal of the second voltage output circuit 102 and the output terminal of the first voltage output circuit 101 is turned off to realize the output of the working voltage. When the switch control circuit 103 is turned on, the path between the first output terminal of the second voltage output circuit 102 and the output terminal of the first voltage output circuit 101 is turned on to realize the output of the aging voltage. In addition, the aging voltage and the working voltage are switched according to the control signal of the controller 104 during the current working time of the power circuit, so as to accelerate the aging speed of the electronic device 105. Thereby, the electronic products are enabled to turn into a stable period before leaving the factory, and the problem that the electronic products fail in due to unstable preliminary work is avoided. As a result, products received by customers are stable and not prone to failure, thereby reducing complaints from customer and improving the quality of the electronic products.

Optionally, the control signal output by the controller 104 is a clock signal.

Figure 2:
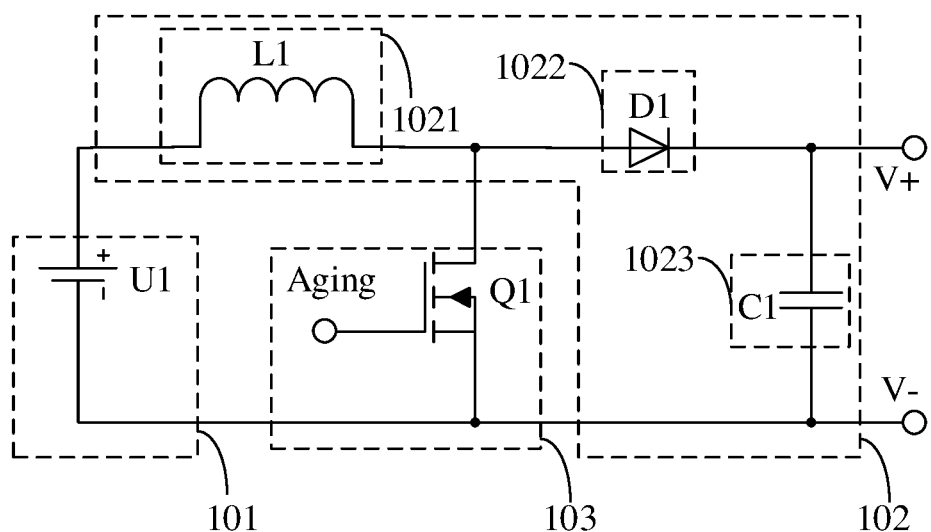
FIG. 2 is a schematic diagram illustrating a circuit of the power circuit of the present application.

Optionally, as shown in FIG. 2, the first voltage output circuit 101 includes a first power supply U1 including a positive pole and a negative pole, and the first power supply U1 provides an operating voltage for the first voltage output circuit 101.

The first power supply U1 is only the simplest power mode, and may also be a power circuit corresponding to the first power supply U1. Therefore, various common power circuits may also be used here. By setting the first voltage output circuit 101 as the first power supply U1, the first power supply U1 may be conveniently selected according to the electronic device 105, so as to achieve the purpose of stable output, and the working voltage of the electronic device may be supplied in the simplest way without any transformation, thus simplifying the circuit.

Optionally, the switch control circuit 103 includes a first switch tube Q1 defined with a first connection terminal, a second connection terminal and a controlled terminal. The controlled terminal of the first switch tube Q1 is the controlled terminal of the switch control circuit 103, the first connection terminal of the first switch tube Q1 is the first input terminal of the switch control circuit 103, the second connection terminal of the first switch tube Q1 is the second input terminal of the switch control circuit 103, and the second connection terminal of the first switch tube Q1 is also the output terminal of the switch control circuit 103.

The first switching tube Q1 may be controlled by a control signal, and may respond in time according to the size of the control signal as performing an opening or closing action with little delay, so that the first signal Aging input therein may be converted into a second signal AgingC according to the change of the control signal. In this condition, the second signal AgingC is a square wave signal consistent with the changing trend of the first signal Aging, thereby the level of an alternating current signal of subsequent input circuit is made stable, more accurate control and faster switching are realized, and the influence on various values of subsequent output voltages is reduced.

Optionally, the first switching tube Q1 is a positive channel Metal Oxide Semiconductor (PMOS), the grid of the PMOS is the controlled terminal of the first switching tube Q1, the source of the PMOS tube is the first terminal of the first switching tube Q1, and the drain of the PMOS tube is the second terminal of the first switching tube Q1.

And, according to the control mode of PMOS, a high voltage is applied, so as to conveniently convert the first signal Aging, which has flown into the circuit, into the second signal AgingC of the square wave. In this case, the power circuit changes the electrical level according to the strength of signals of the square wave. An aging voltage is output to the electronic device 105 at high level, and a working voltage is output to the electronic device 105 at low level, thus realizing the purpose of accelerating the aging of the electronic device 105. In this condition, PMOS is adopted to turn on the circuit at high voltage, thereby the circuit is avoided from being on when the circuit is dormant, and electricity is saved.

Optionally, the second voltage output circuit 102 includes a first energy storage circuit 1021, a second energy storage circuit 1023, and a unilateral conduction circuit 1022. The second voltage output circuit 102 includes an input terminal, a first output terminal, a second output terminal, and a third output terminal. The input terminal of the first energy storage circuit 1021 is the input terminal of the second voltage output circuit 102, the output terminal of the first energy storage circuit 1021 is connected with the input terminal of the unilateral conduction circuit 1022, and the connection node of the first energy storage circuit 1021 and the unilateral conduction circuit 1022 is the first output terminal of the second voltage output circuit 102. The output terminal of the unilateral conducting circuit 1022 is connected with the first terminal of the second energy storage circuit 1023, and the connection node of the unilateral conducting circuit 1022 and the second energy storage circuit 1023 is the third output terminal of the second voltage output circuit 102. The second terminal of the second energy storage circuit 1023 is the second output terminal of the second voltage output circuit 102.

In an embodiment, the first energy storage circuit 1021 is configured to store the voltage output by the first voltage output circuit 101 when the switch control circuit 103 is turned on, and to output the stored voltage to the unilateral conducting circuit 1022 and the second energy storage circuit 1023 when the switch control circuit 103 is turned off, and to output the stored voltage to the electronic device 105. This voltage is a normal voltage. When the switch control circuit 103 is off, the second energy storage circuit 1023 stores the voltage output by the first energy storage circuit 1021, conducts the switch control circuit 103, and the stored voltage is synchronously output to the electronic device 105 by the second energy storage circuit 1023 and the first voltage output circuit 101. The output voltage is the aging voltage, thereby realizing the switching between the aging voltage and the normal voltage. In this way, the power circuit may quickly switch between the normal voltage and the aging voltage through the first energy storage circuit 1021 and the second energy storage circuit 1023. In this case, by accelerating the switching speed, the aging speed may be accelerated, so as to achieve the purpose of saving the power for test, and in addition, the aging of the electronic device 105 may be accelerated.

Optionally, the first energy storage circuit 1021 includes a first inductor L1, a first terminal of the first inductor L1 is an input terminal of the first energy storage circuit 1021, and a second terminal of the first inductor L1 is an output terminal of the first energy storage circuit 1021.

And, the first inductor L1 is the simplest embodiment. In this case, only one inductor is connected, no more power is needed to connect, thereby the control process is avoided from being too complicated, and the modification of the circuit, addition of other voltages, and control of input circuit are avoided. In addition, selecting a new capacity just needs to adjust the first inductor L1 according to need, without modifying the circuits significantly, when the type of the electronic device, the aging voltage, and the working voltage change. In this case, it also may be multiple inductors or other energy storage circuits, all circuits based on energy storage by conductors shall be included.

Optionally, the second energy storage circuit 1023 includes a first capacitor C1, the first terminal of the first capacitor C1 is the first terminal of the second energy storage circuit 1023, and the second terminal of the first capacitor C1 is the second terminal of the second energy storage circuit 1023.

And, the first capacitor C1 is the simplest embodiment. In this case, only one inductor is connected, no more power is needed to connect, thereby the control process is avoided from being too complicated, and the modification of the circuit, addition of other voltages and control of input circuit are also avoided. In addition, selecting a new capacity just needs to adjust the first inductor L1 according to need, without modifying the circuits significantly, when changes of the type of the electronic device, the aging voltage, and the working voltage happened. In this case, it also may be multiple inductors or other energy storage circuits, all circuits based on energy storage by conductors shall be included.

Optionally, the unilateral conducting circuit 1022 includes a first diode D2, the anode of the first diode D2 is the input terminal of the unilateral conducting circuit 1022, and the cathode of the first diode D2 is the output terminal of the unilateral conducting circuit 1022.

The first diode D2 is the simplest embodiment, and only one diode is connected here to realize the stabilization of the output voltage and unilateral conduction. In addition, the connection of other unilateral conduction circuits 1022 or unilateral conduction elements which makes the control process more complicated is avoided, and modifications of the circuit, addition of other voltages and control of input circuit are avoided. In this case, it may be a plurality of diodes or other unilateral conduction circuits 1022, which makes the effect of unilateral conduction more obvious.

Optionally, the power circuit includes a first voltage output circuit 101, a second voltage output circuit 102, a controller 104, and a switch control circuit 103. the switch control circuit 103 includes a first input terminal, a second input terminal, a controlled terminal and an output terminal, an output terminal of the first voltage output circuit 101 is connected with the first input terminal of the switch control circuit, and an output terminal of the second voltage output circuit 102 is connected with the second input terminal of the switch control circuit; the controlled terminal of the switch control circuit 103 is connected with an output terminal of the controller, and the output terminal of the switch control circuit 103 is connected with an input terminal of the electronic device.

The preset failure rate curve of the electronic device is configured to indicate a failure rate of the electronic device during working, and corresponds to an initial, an intermediate, and a later working period of the electronic device according to total working period of the electronic device. The first voltage output circuit 101 provides a normal operating voltage to the electronic device 105, and the normal operating voltage is the voltage of the electronic device 105 in normal working. In the exemplary technology, different electronic devices 105 have different operating voltages, and the normal operating voltage may be adjusted according to actual needs so as to be suitable for a variety of different electronic devices. The second voltage output circuit 102 provides an aging voltage to the electronic device 105, the aging voltage is greater than the normal operating voltage, the aging voltage in the case is the voltage value of the electronic device 105 operating in a limit state, and the aging voltage value of the electronic device 105 is measured in an experiment. The controller 104 stores a preset failure rate curve of an electronic device, and sets one current working time of the power circuit according to the failure rate curve of the electronic device 105. Optionally, the failure rate of most devices is a function of time. A typical failure curve is called the bathtub curve. The shape of the curve is high at two ends and low in the middle, which obviously shows different phases. The phases may be divided into three: early failure period, accidental failure period and severe failure period. Therefore, the current working time is the time length of the curve which represents the early failure rate in the failure rate curve of the electronic device 105. Because in this period, the electronic devices 105 of all types are most likely to fail, making the stability of sold products worse as a result. And, different types of electronic device 105 have different time lengths of the curve representing the early failure rate, which may be obtained in various ways, such as by statistical repair rate of ex-factory products. The controller 104 also outputs a control signal to control the switch control circuit 103 to supply power to the electronic device 105, thereby accelerating the aging, and screening out defective electronic device while accelerating the aging. The early defective rate of the ex-factory electronic devices 105 is reduced as a result. The switch control circuit 103 performs on/off based on the control output by the controller 104 according to a preset failure rate curve of the electronic device, controlling the first voltage output circuit 101 or the second voltage output circuit 102 to output voltage to the electronic device 105. The switch control circuit 103 enables different output terminals of the second voltage output circuits 102 to be gated with the first voltage output circuit 101. When the switch control circuit 103 is off, the path between the first output terminal of the second voltage output circuit 102 and the output terminal of the first voltage output circuit 101 is turned off to realize the output of the working voltage. When the switch control circuit 103 is turned on, the path between the first output terminal of the second voltage output circuit 102 and the output terminal of the first voltage output circuit 101 is turned on to realize the output of the aging voltage. In addition, the aging voltage and the working voltage are switched according to the control signal of the controller 104 in the current working time of the power circuit, so as to accelerate the aging speed of the electronic device 105. Optionally, the control signal output by the controller 104 is a clock signal.

In the above embodiments, in the initial working period, the controller controls the switch control circuit to be turned on or off at the first preset frequency according to the preset periodic control signal, so as to enable the aging degree of the electronic device to reach a target one. The initial working period, when the electronic device is prone to failure, is thereby passed. Therefore, the failure rate of the ex-factory electronic devices is obviously reduced, and the stability of the products is increased. Optionally, the purpose of the present application may be achieved by setting the first preset frequency to be a general frequency value. In this case, the switching speed of the switch control circuit may be conveniently controlled by controlling the first preset frequency to accelerate aging.

Referring to FIGS. 1 and 2 together, the working principle of the power circuit of the embodiment is described in detail as follows:

the control signal CLK (not shown) of the controller 104 controls the turning-on and turning-off of the first switching tube Q1. After entering the first switching tube Q1, the first signal Aging is converted into a second signal AgingC, and then is connected to the circuit a shown in FIG. 2. The first switching tube Q1 is controlled by the control signal CLK. When the first signal Aging is at a low level (normally displayed), the second signal AgingC (not shown) is at a low level regardless of whether the first switching tube Q1 is turned on or not. In this case, the output terminal V+/V− of the power circuit outputs a normal voltage. If the first signal Aging is at a high level (Aging mode), and if the first switching tube Q1 is in an on state, the second signal AgingC is at a high level. And if the first switching tube Q1 is in an off state, the second signal AgingC is at a low level, thereby the first signal AgingC becomes a square wave signal.

During a period when the first signal Aging is at a first high level, the first switching tube Q1 is in an on state and the second signal AgingC is at the high level, in this case, the first power supply U1 charges the first inductor L1 (the inductor generates self-induced electromotive force due to the inductance characteristic). When the second signal AgingC is low, the first switching tube Q1 turn off, the first inductor L1 and the first power supply U1 supply power to the electronic device 105 together, and charge the first capacitor C1. When the second signal AgingC becomes high again, the first power supply U1 charges the first inductor L1 again. And, the electronic device 105 is powered by the first power supply U1 and the first capacitor C1. When the first signal Aging is at a first low level, the second signal AgingC is at a low level, therefore only the first power supply U1 supplies power to the electronic device 105, which repeats all the time. Thus, when the first signal Aging is low (normal mode), the power circuit normally output. When the first signal Aging is high (aging mode), the output voltage of the output terminal V+/V− of the power circuit is the sum of the voltage VGH of the first power supply U1 and the voltage VL of the first capacitor C1, or the sum of the voltage VGH of the first inductor L1 and the voltage VL of the first power supply U1. The normal mode and aging mode of electronic devices are switched with the change of the levels of the first signal Aging, so as to accelerate aging. Defective electronic devices are thereby detected and the stability and yield of ex-factory electronic devices 105 are improved.

In addition, the present application also provides a testing device, which includes the power circuit describe above, the first output terminal of the power circuit is connected with the positive input terminal of the electronic device 105, and the second output terminal of the power circuit is connected with the negative input terminal of the electronic device 105.

And, since the testing device of the present application includes the above-mentioned power circuit, the testing device of the present application includes all embodiments and beneficial technical effects of the power circuit.

According to the technical solutions disclosed in the present application, defective electronic devices may be detected in an accelerated aging mode, thereby improving the stability and the yield of qualified electronic devices.

The above are only the optional embodiments of the present disclosure and are not therefore limiting the scope of the patent disclosure. Any equivalent structural change made under the inventive concept of the present disclosure using the contents of the present disclosure specification and drawings, or directly/indirectly applied in other related technical fields, is included in the scope of the patent protection of the present disclosure.

What is claimed is:

1. A power circuit, applied to an electronic device, wherein the power circuit comprises:
   a first voltage output circuit, configured to provide a normal operating voltage to the electronic device;
   a second voltage output circuit, configured to provide an aging voltage to the electronic device, the aging voltage being greater than the normal operating voltage;
   a controller, configured to store a preset failure rate curve of the electronic device; and
   a switch control circuit, configured to switch on/off based on control of the controller according to the preset failure rate curve of the electronic device, to control the first voltage output circuit or the second voltage output circuit to provide a voltage to the electronic device; wherein
   the switch control circuit comprises a first input terminal, a second input terminal, a controlled terminal, and an output terminal, an output terminal of the first voltage output circuit is connected with the first input terminal of the switch control circuit, an output terminal of the second voltage output circuit is connected with the second input terminal of the switch control circuit, the controlled terminal of the switch control circuit is connected with an output terminal of the controller, and the output terminal of the switch control circuit is connected with an input terminal of the electronic device;
   the switch control circuit comprises a first switch tube defined with a first connection terminal, a second connection terminal, and a controlled terminal, the controlled terminal of the first switch tube is the controlled terminal of the switch control circuit, the first connection terminal of the first switch tube is the first input terminal of the switch control circuit, and the second connection terminal of the first switch tube is the second input terminal of the switch control circuit, and is also the output terminal of the switch control circuit.

2. The power circuit according to claim 1, wherein the first switch tube is a positive channel Metal Oxide Semiconductor, a grid of the positive channel Metal Oxide Semiconductor is the controlled terminal of the first switch tube, a source of the positive channel Metal Oxide Semiconductor is the first terminal of the first switch tube, and a drain of the positive channel Metal Oxide Semiconductor is the second terminal of the first switch tube.

3. The power circuit according to claim 1, wherein the second voltage output circuit comprises a first energy storage circuit, a second energy storage circuit, and a unilateral conduction circuit, an input terminal of the first energy storage circuit is an input terminal of the second voltage output circuit, and an output terminal of the first energy storage circuit is respectively connected with an input terminal of the unilateral conduction circuit and the first connection terminal of the first switch tube; an output terminal of the unilateral conduction circuit is connected with a first terminal of the second energy storage circuit, and a connection node of the unilateral conduction circuit and the second energy storage circuit is the output terminal of the second voltage output circuit; and a second terminal of the second energy storage circuit is connected with the second connection terminal of the first switch tube.

4. The power circuit according to claim 3, wherein the first energy storage circuit comprises a first inductor, a first terminal of the first inductor is the input terminal of the first energy storage circuit, and a second terminal of the first inductor is the output terminal of the first energy storage circuit.

5. The power circuit according to claim 3, wherein the second energy storage circuit comprises a first capacity, a first terminal of the first capacity is the first terminal of the second energy storage circuit, and a second terminal of the first capacity is the second terminal of the second energy storage circuit.

6. The power circuit according to claim 3, wherein the unilateral conduction circuit comprises a first diode, an anode of the first diode is the input terminal of the unilateral conduction circuit, and a cathode of the first diode is the output terminal of the unilateral conduction circuit.

7. The power circuit according to claim 1, wherein the preset failure rate curve of the electronic device is configured to indicate a failure rate of the electronic device during working, and corresponds to an initial working period, an intermediate working period, and a later working period of the electronic device according to a total working period of the electronic device; wherein,
in the initial working period, the controller controls the switch control circuit to be turned on or off at a first preset frequency according to a preset periodic control signal, to allow the electronic device reaching a target degree of aging.

8. The power circuit according to claim 1, wherein the first voltage output circuit comprises a first power supply comprising a positive pole and a negative pole.

9. The power circuit according to claim 1, wherein a control signal output by the controller is a clock signal.

10. A power circuit, applied in an electronic device, wherein the power circuit comprises:
a first voltage output circuit, configured to provide a normal operating voltage to the electronic device;
a second voltage output circuit, configured to provide an aging voltage to the electronic device, the aging voltage being greater than the normal operating voltage;
a controller, configured to store a preset failure rate curve of the electronic device; and
a switch control circuit, configured to switch on/off based on control of the controller according to the preset failure rate curve of the electronic device, to control the first voltage output circuit or the second voltage output circuit to provide a voltage to the electronic device; wherein
the preset failure rate curve of the electronic device is configured to indicate a failure rate of the electronic device during working, and corresponds to an initial, an intermediate, and a later working periods of the electronic device according to a total working periods of the electronic device, and in the initial working period, the controller controls the switch control circuit to be turned on or off at a first preset frequency according to a preset periodic control signal, to allow the electronic device reaching a target degree of aging;
the switch control circuit comprises a first input terminal, a second input terminal, a controlled terminal and an output terminal, an output terminal of the first voltage output circuit is connected with the first input terminal of the switch control circuit, and an output terminal of the second voltage output circuit is connected with the second input terminal of the switch control circuit; the controlled terminal of the switch control circuit is connected with an output terminal of the controller, and the output terminal of the switch control circuit is connected with an input terminal of the electronic device;
the switch control circuit comprises a first switch tube defined with a first connection terminal, a second connection terminal, and a controlled terminal, the controlled terminal of the first switch tube is the controlled terminal of the switch control circuit, the first connection terminal of the first switch tube is the first input terminal of the switch control circuit, and the second connection terminal of the first switch tube is the second input terminal of the switch control circuit, and is also the output terminal of the switch control circuit.

11. A testing device, comprising a power circuit, wherein the power circuit is applied to an electronic device and comprises:
a first voltage output circuit, configured to provide a normal operating voltage to the electronic device;
a second voltage output circuit, configured to provide an aging voltage to the electronic device, the aging voltage being greater than the normal operating voltage;
a controller, configured to store a preset failure rate curve of the electronic device; and
a switch control circuit, configured to switch on/off based on control of the controller according to the preset failure rate curve of the electronic device, to control the first voltage output circuit or the second voltage output circuit to provide a voltage to the electronic device; wherein
a first output terminal of the power circuit is connected with a positive input terminal of the electronic device, and a second output terminal of the power circuit is connected with a negative input terminal of the electronic device;
the switch control circuit comprises a first input terminal, a second input terminal, a controlled terminal and an output terminal, an output terminal of the first voltage output circuit is connected with the first input terminal of the switch control circuit, and an output terminal of the second voltage output circuit is connected with the second input terminal of the switch control circuit; the controlled terminal of the switch control circuit is connected with an output terminal of the controller, and the output terminal of the switch control circuit is connected with an input terminal of the electronic device;

the switch control circuit comprises a first switch tube defined with a first connection terminal, a second connection terminal, and a controlled terminal, the controlled terminal of the first switch tube is the controlled terminal of the switch control circuit, the first connection terminal of the first switch tube is the first input terminal of the switch control circuit, and the second connection terminal of the first switch tube is the second input terminal of the switch control circuit, and is also the output terminal of the switch control circuit.

12. The testing device according to claim 11, wherein the first switch tube is a positive channel Metal Oxide Semiconductor, a grid of the positive channel Metal Oxide Semiconductor is the controlled terminal of the first switch tube, a source of the positive channel Metal Oxide Semiconductor is the first terminal of the first switch tube, and a drain of the positive channel Metal Oxide Semiconductor is the second terminal of the first switch tube.

13. The testing device according to claim 11, wherein the second voltage output circuit comprises a first energy storage circuit, a second energy storage circuit, and a unilateral conduction circuit, an input terminal of the first energy storage circuit is an input terminal of the second voltage output circuit, and an output terminal of the first energy storage circuit is respectively connected with an input terminal of the unilateral conduction circuit and the first connection terminal of the first switch tube; an output terminal of the unilateral conduction circuit is connected with a first terminal of the second energy storage circuit, and a connection node of the unilateral conduction circuit and the second energy storage circuit is the output terminal of the second voltage output circuit; and a second terminal of the second energy storage circuit is connected with the second connection terminal of the first switch tube.

14. The testing device according to claim 13, wherein the first energy storage circuit comprises a first inductor, a first terminal of the first inductor is the input terminal of the first energy storage circuit, and a second terminal of the first inductor is the output terminal of the first energy storage circuit.

15. The testing device according to claim 13, wherein the second energy storage circuit comprises a first capacity, a first terminal of the first capacity is the first terminal of the second energy storage circuit, and a second terminal of the first capacity is the second terminal of the second energy storage circuit.

16. The testing device according to claim 13, wherein the unilateral conduction circuit comprises a first diode, an anode of the first diode is the input terminal of the unilateral conduction circuit, and a cathode of the first diode is the output terminal of the unilateral conduction circuit.

* * * * *